United States Patent [19]

Davis

[11] 4,403,200
[45] Sep. 6, 1983

[54] OUTPUT STAGE FOR OPERATIONAL AMPLIFIER

[75] Inventor: William F. Davis, Tempe, Ariz.

[73] Assignee: Motorola, Inc., Schaumburg, Ill.

[21] Appl. No.: 295,880

[22] Filed: Aug. 24, 1981

[51] Int. Cl.³ .......................... H03F 1/34; H03F 3/14
[52] U.S. Cl. ..................................... 330/294; 330/307
[58] Field of Search ............... 330/255, 260, 262, 273, 330/274, 294, 307, 310

[56] References Cited

U.S. PATENT DOCUMENTS 3,529,184  9/1970  Conklin ............................... 330/260

*Primary Examiner*—James B. Mullins
*Assistant Examiner*—Gene Wan

*Attorney, Agent, or Firm*—Vincent B. Ingrassia

[57] ABSTRACT

An operational amplifier includes an input stage, an output stage including first, second and third NPN output transistors, and an intermediate stage including first and second emitter follower transistors. The first NPN output transistor sources load current to an output terminal while the second and third NPN output transistors sink load current from the output terminal. A diode is coupled across the collectors of the second and third NPN output transistors to conduct possible short circuit currents. Additionally, a pair of series coupled resistors are coupled across the collectors of the second and third NPN output transistors. A Miller capacitor is coupled between the input of the intermediate stage and the junction of the first and second resistors.

9 Claims, 1 Drawing Figure

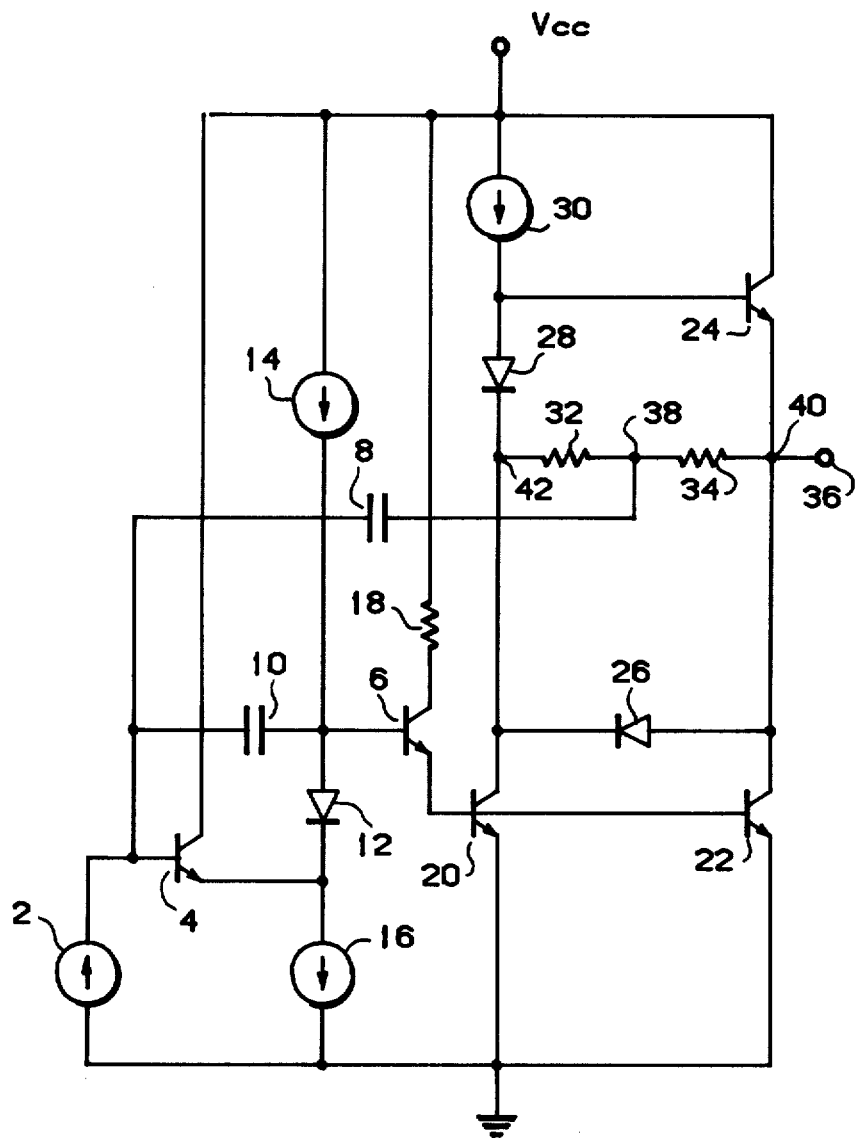

OUTPUT STAGE FOR OPERATIONAL AMPLIFIER

BACKGROUND OF THE INVENTION

1. Field of the Invention

This invention relates generally to operational amplifiers, and more particularly, to an all NPN monolithically integrable output stage for integrated operational amplifiers in which excess phase shift due to capacitive loads and second order distortions due to non-linearities in the input/output transfer function are both substantially reduced.

2. Description of the Prior Art

A large majority of commercially available operational amplifiers which possess both pull-up and pull-down output capability include PNP devices. To achieve a higher frequency response, greater output swing, reduce output stage emitter follower peaking and excess phase with capacitive loads, and simplify integrated circuit construction, it has been found desirable to provide an output stage which incorporates only NPN transistors. Such an output circuit is shown and described in U.S. Pat. No. 3,416,092. However, there are several problems associated with this circuit. First, the output voltage is not linearly related to the input voltage as a result of crossover distortion produced by the classic deadband technique. Second, when the output is sinking current from the load, the output voltage can only be pulled to within approximately 1 volt of the negative rail voltage regardless of the sink current magnitude. Third, when the output sources current to the load, the output voltage can only swing to within approximately 1.8 volts of the positive rail. Finally, no part of the output stage inherently provides any controlled current limiting capability.

Co-pending U.S. patent application, Ser. No. 244,411 filed Mar. 16, 1981, entitled "Amplifier Output Stage" and assigned to the assignee of the present invention describes an all NPN output stage wherein the crossover distortion due to deadband has been eliminated and, as a result of using only NPN transistors, the output quiescent current can be precisely defined and controlled over processing variations and temperature. A first NPN transistor sinks current from the output of the circuit when the first transistor is turned on by a varying input signal. A second transistor is coupled to the output of the circuit and sources a second current to the output when the first transistor turns off. A resistor coupled between the collector of the first transistor and the emitter of the second transistor provides a voltage drop thereacross proportional to the amount of current being sunk by the first transistor so as to control the voltage at the base of the second transistor. In this way, the second transistor is turned on and off as a first transistor is turned off and on respectively. Diode means provide a voltage level shift between the resistor and the base of the second transistor.

While eliminating distortion due to deadband, the circuit of the above cited application still suffers from a second order large signal distortion as a result of non-linearities in the transfer function due to large current variations in both the first NPN sink transistor and the second NPN source transistor. It is important to note that with the addition of a Miller compensation capacitor across the stage containing the first NPN transistor, the distortion at the collector of the first NPN transistor contains primarily the nonlinear terms associated with the first NPN transistor. In contrast, the distortion from the collector of the first transistor to the output is significantly greater due to the gain variations associated with the output current source circuitry including the second NPN transistor; i.e. the major distortion is caused by the source circuitry. Furthermore, if the output of the circuit were to become short circuited to the positive supply rail, the emitter-base junction of the second transistor may break down.

SUMMARY OF THE INVENTION

It is an object of the present invention to provide an improved output stage for an operational amplifier.

It is a further object of the present invention to provide an all NPN operational amplifier output stage characterized by no deadband distortion and minimal second order distortion.

It is a still further object of the present invention to provide an all NPN output stage for an operational amplifier, the output current sourcing portion thereof being protected from all short circuits.

It is yet another object of the present invention to provide an improved operational amplifier for driving capacitive loads with a minimum effect on amplifier stability.

According to a broad aspect of the invention there is provided an operational amplifier for providing load current to an output terminal comprising: an input stage; an output stage including first, second and third NPN output transistors each having base, emitter and collector terminals, said first NPN output transistor having emitter coupled to said output terminal for conducting load current thereto and said second and third NPN output transistors having collectors coupled to said output terminal for sinking load current therefrom, said output stage including first and second series coupled resistors coupled between said output terminal and said second NPN output transistor; at least a first emitter follower transistor coupled between the output of said input stage and the base of said second NPN output transistor; a first capacitor coupled between the output of said input stage and the junction of said first and second series coupled resistors, said first capacitor for frequency stabilizing said amplifier.

BRIEF DESCRIPTION OF THE DRAWINGS

The above, and other objects, features and advantages of the present invention will be more clearly understood from the following detailed description taken in conjunction with the accompanying drawing which is a schematic diagram of an operational amplifier utilizing an all NPN output stage in accordance with the teaching of the present invention.

DESCRIPTION OF THE PREFERRED EMBODIMENT

The operational amplifier shown in the drawing includes an input stage (for example, a differential input stage) generally represented by current source 2. The amplifier's second stage comprises transistors 4 and 6, Miller capacitance 8, a stabilizing capacitor 10, a level shifting diode 12, current sources 14 and 16 and collector resistor 18. The amplifier's output stage includes NPN transistors 20, 22, and 24, diodes 26 and 28, current source 30 and split resistors 32 and 34.

For discussion of how a differential input stage, represented as a current source/sink 2 in the drawing, reference is made to co-pending patent application, Ser. No. 293753 filed on Aug. 17, 1981, entitled "Operational Amplifier" and assigned to the assignee of the present invention. Suffice it to say at this time that if the input stage is a differential one, one set of inputs will result in current being sourced to the base of transistor 4 while another set of inputs will result in base drive current being diverted from the base of transistor 4 which is actually the input of the amplifier's second stage.

Transistor 4 has a collector coupled to a first source of supply voltage ($V_{CC}$) and an emitter coupled to the junction of the cathode of diode 12 and a first terminal of current source 16. The second terminal of current source 16 is coupled to a second source of supply voltage (in this case ground). A stabilizing capacitor 10 is coupled between the anode of diode 12 and the base of transistor 4. The anode of diode 12 is also coupled via current source 14 to $V_{CC}$. The base of transistor 6 is coupled to the junction of capacitor 10 and the anode of diode 12. The collector of transistor 6 is coupled via collector resistor 18 to $V_{CC}$, and the emitter of transistor 6 is coupled to the base electrodes of transistors 20 and 22. Transistors 4 and 6 are actually emitter-follower transistors and help supply the required base current loading isolation between the circuit output and the output of the input stage.

This portion of the circuit, i.e., the second stage will not be discussed further since it is described in detail in the above reference co-pending patent application.

Transistors 20 and 22 each have emitters coupled to ground, and a diode 26 is coupled across their collectors; i.e., diode 26 has an anode coupled to the collector of transistor 22 and a cathode coupled to the collector of transistor 20. The collector of transistor 22 is also coupled to output terminal 36 as is the anode of diode 26 and the emitter of transistor 24. Also coupled across the collectors of transistors 20 and 22 is a series resistor pair comprising resistors 32 and 34 having a junction node 38.

Miller capacitor 8 is coupled between node 38 and the base of transistor 4. As node 38 is moved towards node 40 bringing more resistance into the second stage Miller loop, the circuit exhibits less distortion but its capability to drive capacitive loads without introducing additional excess phase shift is substantially reduced. On the other hand, as node 38 is moved towards node 42 reducing the resistance in the loop, the circuit exhibits more distortion but its capacitive load drive capability is improved.

Transistor 24 has a collector coupled to $V_{CC}$ and a base coupled to the junction of one terminal of current source 30 and the anode of diode 28, the other terminal of current source 30 being coupled to $V_{CC}$. When sufficient base drive is applied to the base terminals of transistors 20 and 22, transistors 20 and 22 will turn on and current will flow from an external load coupled to output terminal 36 through transistors 20 and 22. In fact, load current will flow one-half through transistor 22 and one-half through the series combination of resistors 32 and 34 and then through transistor 20 since the emitter-base junction areas are assumed to be the same. This ratio could, however, be any given value. The load current and the values of resistors 32 and 34 are sufficiently small so as not to render diode 26 conductive during normal load current operation. If, for example, half the load current were 2 milliamp and the combination of resistors 32 and 34 have a value of 200 ohms the voltage drop across the resistors would be 400 mV, and thus the voltage at the cathode of diode 28 would be the output voltage appearing at terminal 36 minus 400 mV. The voltage at the base of transistor 24 would be approximately 300 mV higher than the output voltage at terminal 36 assuming a 700 mV drop across diode 28. As a result, this low base-emitter voltage will cause transistor 24 to remain off, transistor 22 will sink one-half the load current, and transistor 20 will sink one-half the load current flowing through resistors 32 and 34, and the current being supplied by current source 30. However, as the voltage at the base terminals of transistors 20 and 22 become sufficiently lower, transistors 20 and 22 will become less conductive and transistor 24 will become more conductive. This occurs because as the current in transistors 20 and 22 is reduced, the current through resistors 32 and 34 will be reduced as will the voltage drop thereacross. If, for example, the drive current through resistors 32 and 34 fell to 100 microamps, the voltage at the cathode of diode 28 would become equal to the output voltage minus 20 mV. Therefore, again assuming a 700 mV voltage drop across diode 28, the voltage at the base of transistor 24 would be approximately 680 mV higher than the output voltage. This is sufficient to cause transistor 24 to become conductive. As the voltage at the base terminals of transistors 20 and 22 again increase, transistors 20 and 22 will again turn on pulling more current through resistor pair 32 and 34. This in turn will cause a gradual reduction in the voltage at the base of transistor 24 slowly turning it off.

Diode 26 is provided to protect transistor 24 in the event that output terminal 36 should become shorted to the positive rail $V_{CC}$ when transistors 20 and 22 are on. Were it not for diode 26, a very high current would flow through resistors 32 and 34 causing a detrimental breakdown of the base-emitter junction of transistor 24 through diode 28. With diode 26 connected as shown, a portion of the short circuit current is conducted through diode 26 and transistor 20 bypassing series resistors 32 and 34. The sourcing portion of the output stage inherently current limits short circuits between output terminal 36 and the negative rail or ground.

The above description is given by way of example only. Changes in form and details may be made by one skilled in the art without departing from the scope of the invention as defined by the appended claims.

I claim:

1. An operational amplifier for providing load current to an output terminal comprising:
    an input stage;
    an output stage including first, second and third NPN output transistors each having base, emitter and collector terminals, said first NPN output transistor having emitter coupled to said output terminal for conducting load current thereto and said second and third NPN output transistors having collectors coupled to said output terminal for sinking load current therefrom, said output stage including first and second series coupled resistors coupled between said output terminal and the collector terminal of said second NPN output transistor;
    at least a first emitter follower transistor coupled between the output of said input stage and the base of said second NPN output transistor;
    a first capacitor coupled between the output of said input stage and the junction of said first and second series coupled resistors, said first capacitor for frequency stabilizing said amplifier.

2. An operational amplifier according to claim 1 further comprising a diode having an anode coupled to the collector of said third NPN output transistor and a cathode coupled to the collector of said second NPN output transistor for conducting short circuit current through said second NPN output transistor if said output terminal becomes shorted to a source of supply voltage.

3. An operational amplifier according to claim 2 wherein said first emitter follower transistor, said second NPN output transistor, said first capacitor and one of said first and second series coupled resistors form a loop and wherein said operational amplifier further comprises first means coupled to said first emitter follower transistor and to said first capacitor for stabilizing said loop.

4. An operational amplifier according to claim 3 wherein said output stage further comprises:
   a first current source coupled between a first source of supply voltage and the base terminal of said first NPN output transistor;
   a diode coupled between said first current source and the collector of said second NPN output transistor, the base of said first NPN output transistor being coupled to the junction of said first current source and the anode of said second diode.

5. An operational amplifier according to claim 4 comprising first and second emitter follower transistors coupled between the output of said input stage and the base of said second NPN output transistor wherein said first emitter follower transistor has base, emitter, and collector terminals, said base being coupled to the output of said input stage and said collector being coupled to said first source of supply voltage, and wherein said second emitter follower transistor has a base coupled to the emitter of said first emitter follower transistor, has a collector coupled to said first source of supply voltage and has an emitter coupled to the base of said second and third NPN output transistors.

6. An operational amplifier according to claim 5 further comprising:
   a second capacitor coupled between the base of said first emitter follower transistor and the base of said second emitter follower transistor;
   a third diode having anode coupled to the base of said second emitter follower transistor and a cathode coupled to the emitter of said first emitter follower transistor;
   a first current source coupled between said first source of supply voltage and the anode of said third diode; and
   a second current source coupled between the cathode of third diode and a second source of supply voltage.

7. An operational amplifier according to claim 1 wherein said at least a first emitter follower transistor is also coupled to the base of said third NPN output transistor.

8. An operational amplifier for providing load current to an output terminal comprising:
   an input stage;
   an output stage including first and second NPN output transistors each having base, emitter and collector terminals, said first output transistor having an emitter coupled to said output terminal for conducting load current thereto and said second transistor having a collector coupled to said output terminal for sinking load current therefrom, said output stage including first and second series coupled resistors coupled between said output terminal and the collector terminal of said second output transistor;
   at least one emitter follower transistor coupled between the output of said input stage and the base of said second output transistor; and
   a first capacitor coupled between the output of said input stage and the junction of said first and second series coupled resistors for frequency stabilizing said amplifier.

9. An operational amplifier according to claim 8 wherein said first resistor coupled between said output terminal and said junction has zero resistance.

* * * * *